(12) United States Patent
    Cheah et al.

(10) Patent No.: US 10,840,177 B2
(45) Date of Patent: Nov. 17, 2020

(54) INTERPOSER WITH FLEXIBLE PORTION

(71) Applicant: Intel Corporation, Santa Clara, CA (US)

(72) Inventors: Bok Eng Cheah, Bukit Gambir (MY); Jackson Chung Peng Kong, Tanjung Tokong (MY); Min Suet Lim, Simpang Ampat (MY); Tin Poay Chuah, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/423,715

(22) Filed: May 28, 2019

(65) Prior Publication Data

US 2020/0006204 A1    Jan. 2, 2020

(30) Foreign Application Priority Data

Jun. 28, 2018   (MY) .......................... PI 2018001201

(51) Int. Cl.

| H01L 23/498 | (2006.01) |
| H05K 1/18 | (2006.01) |
| H05K 1/14 | (2006.01) |
| H05K 3/36 | (2006.01) |
| H01L 23/538 | (2006.01) |
| H05K 3/46 | (2006.01) |

(52) U.S. Cl.
    CPC .... H01L 23/4985 (2013.01); H01L 23/49816 (2013.01); H01L 23/5387 (2013.01); H05K 1/144 (2013.01); H05K 1/147 (2013.01); H05K 1/189 (2013.01); H05K 3/361 (2013.01); H05K 3/4697 (2013.01); *H05K 2201/10378* (2013.01)

(58) Field of Classification Search
    CPC ........... H01L 23/49816; H01L 23/4985; H01L 23/5387; H05K 1/144; H05K 1/147; H05K 1/189; H05K 3/361; H05K 3/4697
    See application file for complete search history.

(56) References Cited

U.S. PATENT DOCUMENTS

| 2014/0104776 A1* | 4/2014 | Clayton | .................. G06F 1/184 361/679.31 |
| 2016/0190035 A1* | 6/2016 | Na | .......................... H01L 25/105 257/712 |
| 2018/0255639 A1* | 9/2018 | Bergman | ............. D03D 1/0082 |

* cited by examiner

*Primary Examiner* — Andrew Q Tran
(74) *Attorney, Agent, or Firm* — Schwegman Lundberg & Woessner, P.A.

(57) ABSTRACT

To address the issue of shrinking volume that can be allocated for electrical components, a system can use an interposer with a flexible portion. A first portion of the interposer can electrically connect to a top side of a motherboard. A flexible portion of the interposer, adjacent to the first portion, can wrap around an edge of the motherboard. A peripheral portion of the interposer, adjacent to the flexible portion, can electrically connect to a bottom side of the motherboard. The peripheral portion can be flexible or rigid. The interposer can define a cavity that extends through the first portion of the interposer. A chip package can electrically connect to the first portion of the interposer. The chip package can be coupled to at least one electrical component that extends into the cavity when the chip package is connected to the interposer.

20 Claims, 12 Drawing Sheets

INTERPOSER WITH FLEXIBLE PORTION

PRIORITY

This application claims the benefit of priority to Maylaysia Application Serial No. PI 2018001201, filed Jun. 28, 2018, which is incorporated by reference herein in its entirety.

FIELD OF THE DISCLOSURE

The present disclosure relates generally to an interposer that can electrically connect a chip package to a motherboard.

BACKGROUND OF THE DISCLOSURE

As technology evolves, and circuitry shrinks in size, it can be difficult to allocate volume within a system to accommodate electrical components.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

To address the issue of shrinking volume that can be allocated for electrical components, a system can use an interposer with a flexible portion.

A first portion of an interposer can electrically connect to a top side of a motherboard. A flexible portion of the interposer, adjacent to the first portion, can wrap around an edge of the motherboard. A peripheral portion of the interposer, adjacent to the flexible portion, can electrically connect to a bottom side of the motherboard. The peripheral portion can be flexible or rigid. The interposer can define a cavity that extends through the first portion of the interposer. A chip package can electrically connect to the first portion of the interposer. The chip package can be coupled to at least one electrical component that extends into the cavity when the chip package is connected to the interposer.

The interposer and cavity can allow for an increased size of the electrical component or components, optionally without using a potentially costly recess in the motherboard. In some examples, the interposer and cavity can allow for an increased battery size, which can lengthen a time that a device can be used before recharging.

Figure 1:
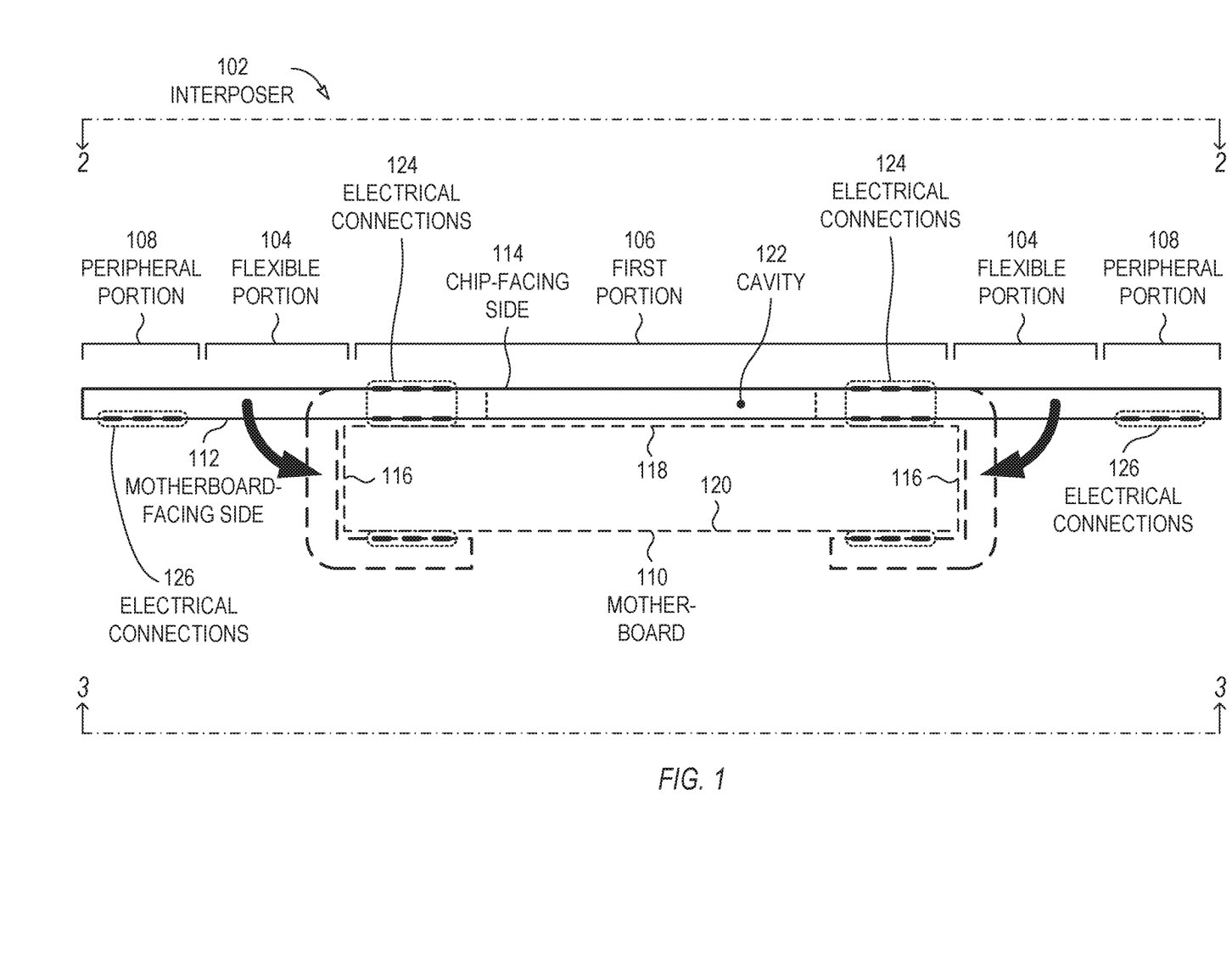
FIG. 1 shows an example of an interposer with a flexible portion, in accordance with some examples, in which the peripheral portions of the interposer are rigid.
Figure 2:
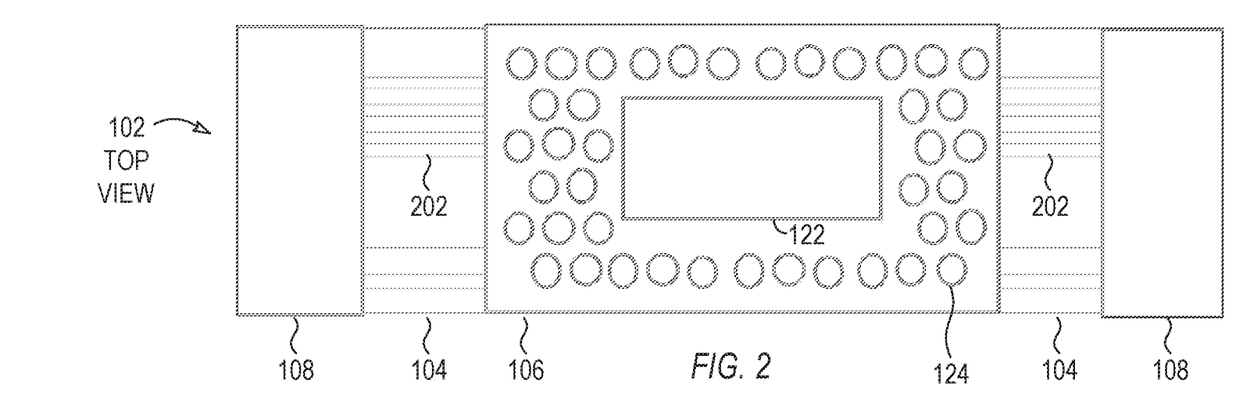
FIG. 2 shows a top view of the interposer of FIG. 1, in accordance with some examples.
Figure 3:
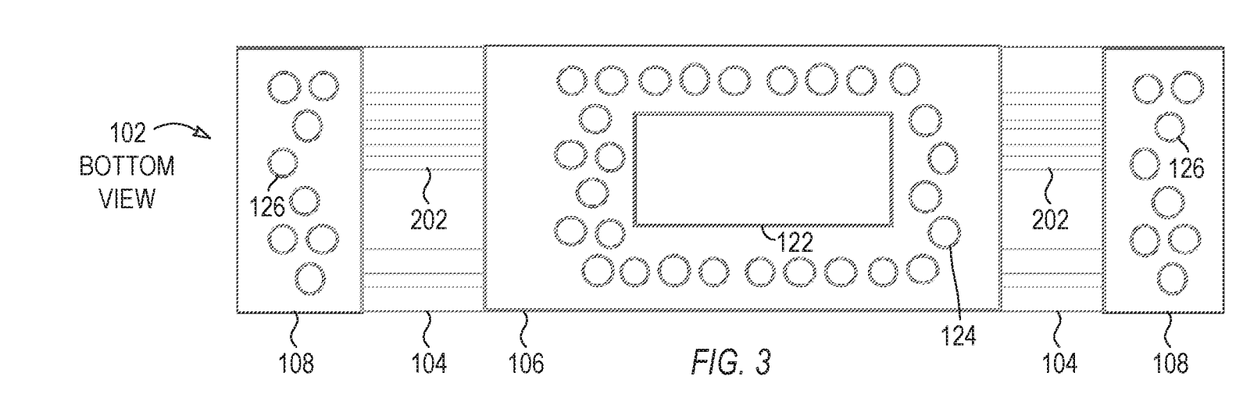
FIG. 3 shows a bottom view of the interposer of FIG. 1, in accordance with some examples.

FIG. 1 shows an example of an interposer 102 with a flexible portion 104, in accordance with some examples, in which the peripheral portions of the interposer 102 are rigid. FIG. 2 shows a top view of the interposer 102 of FIG. 1, in accordance with some examples. FIG. 3 shows a bottom view of the interposer 102 of FIG. 1, in accordance with some examples. The configuration of FIGS. 1-3 is but one example of an interposer 102 with a flexible portion 104. Other suitable interposers can also be used. In the examples of FIGS. 1-3, the longitudinal ends of the interposer 102 are rigid, as discussed below.

The interposer 102 can include three portions, including a first portion 106, a flexible portion 104, and a peripheral portion 108. The first portion 106 can electrically connect to a top side of the motherboard 110. The flexible portion 104, adjacent to the first portion 106, can wrap around an edge of the motherboard 110. The peripheral portion 108, adjacent to the flexible portion 104, can electrically connect to a bottom side of the motherboard 110.

The interposer 102 can include a motherboard-facing side 112, and a chip-facing side 114 opposite the motherboard-facing side 112. As the interposer 102 is wrapped around an edge 116 of a motherboard 110, the motherboard-facing side 112 remains facing the motherboard 110, and can electrically connect to the top side 118 of the motherboard 110 (at the first portion 106) and the bottom side 120 of the motherboard 110 (at the peripheral portion 108).

In some examples, the first portion 106 of the interposer 102 can define a cavity 122 that extends from the motherboard-facing side 112 of the interposer 102 to chip-facing side 114 of the interposer 102. In some examples, the cavity 122 can extend fully through the interposer 102; in other examples, the cavity 122 can extend only partially into the interposer 102.

In some examples, a chip package can electrically connect to the chip-facing side 114 of the first portion 106 of the interposer 102. The chip package is not shown in FIGS. 1-3, but is discussed in detail with regard to FIG. 4.

The extra volume provided by the cavity 122 (e.g., the thickness of the interposer 102, multiplied by a surface area or footprint of the cavity 122) can be beneficial. In some examples, the extra volume provided by the cavity 122 can avoid using a potentially costly recess in the motherboard 110, which is beneficial. For example, interposer 102 and the cavity 122 can allow the use of a type 3 circuit board for the motherboard 110, rather than a type 4 circuit board. The type 4 circuit board includes a recessed portion that is formed by micro laser drilling, which increases the cost over the type 3 circuit board.

In some examples, the first portion 106 of the interposer 102 can include a plurality of contact pads 124 positioned around the cavity 122 on the motherboard-facing side 112 of the interposer 102 and the chip-facing side 114 of the interposer 102. For example, the cavity 122 can occupy a central area of the first portion 106 of the interposer 102, and the contact pads 124 can be positioned around the cavity 122 in a peripheral area of the first portion 106 of the interposer 102.

In some examples, the first portion 106 of the interposer 102 can be rigid. In some of these examples, the first portion 106 of the interposer 102 can be formed from a pair of rigid layers surrounding a flexible interior. In some examples, each electrical connection on the first portion 106 can be a ball grid assembly pad formed as a hole in the respective rigid layer that exposes a conductive material (e.g., metal pad, metal via, or metal routing) beneath the rigid layer. Other suitable constructions can also be used.

In some examples, the peripheral portion 108 of the interposer 102 can include a plurality of contact pads 126 on the motherboard-facing side 112 of the interposer 102. In some of these examples, the flexible portion 104 can electrically connect the contact pads 126 on the peripheral portion 108 of the interposer 102 to corresponding contact pads 124 on the first portion 106 of the interposer 102, through connections 202 (FIGS. 2-3). In some examples, the flexible portion 104 can be bent by 180 degrees in a U-shape such that the motherboard-facing side 112 of the interposer 102 bends concavely, and the chip-facing side 114 of the interposer 102 bends convexly. In some examples, when the flexible portion 104 is bent by 180 degrees, the plurality of contact pads 126 on the motherboard-facing side 112 of the interposer 102 can be positioned on a sidewall of the U-shape facing an interior of the U-shape.

In some examples, the peripheral portion 108 of the interposer 102 can be flexible. In other examples, the peripheral portion 108 of the interposer 102 can be rigid. In some of these examples, the peripheral portion 108 of the interposer 102 can be formed from a pair of rigid layers surrounding a flexible interior. In some of these examples, each electrical connection on the peripheral portion 108 can be a ball grid assembly pad formed as a hole in the respective rigid layer that exposes a conductive material (e.g., metal pad, metal via, or metal routing) beneath the rigid layer. Other suitable constructions can also be used.

In some examples, the interposer 102 can be formed as a ribbon, with one or more rigid portions along a length of the ribbon. The rigid portions can correspond to the first portion 106, which can optionally be a central portion of the interposer 102, and, optionally, one or more peripheral portions 108. Each rigid portion can be formed from a pair of rigid layers surrounding a flexible interior, or by another suitable construction.

In some examples, the interposer 102 can be shaped as a generally planar elongated rectangle, in its unconnected form (e.g., before it is wrapped around the motherboard 110). In some examples, the peripheral portion 108 can be positioned at an edge of the rectangle, the flexible portion 104 can be positioned directly adjacent to the peripheral portion 108, and the first portion 106 can be positioned directly adjacent to the flexible portion 104, such as at a central portion of the rectangle. In these examples, there may be just one flexible portion 104 and just one peripheral portion 108. In other examples, such as the specific configuration shown in FIGS. 1-3, one or more portions can include two or more non-contiguous regions. For example, the peripheral portion 108 can include two non-contiguous peripheral portions 108, where each non-contiguous peripheral portion 108 can extend to a respective edge of the rectangle. As another example, the flexible portion 104 can include two non-contiguous flexible portions 104, where each non-contiguous flexible portion 104 can be positioned between the first portion 106 and a respective non-contiguous peripheral portion 108.

Figure 4:
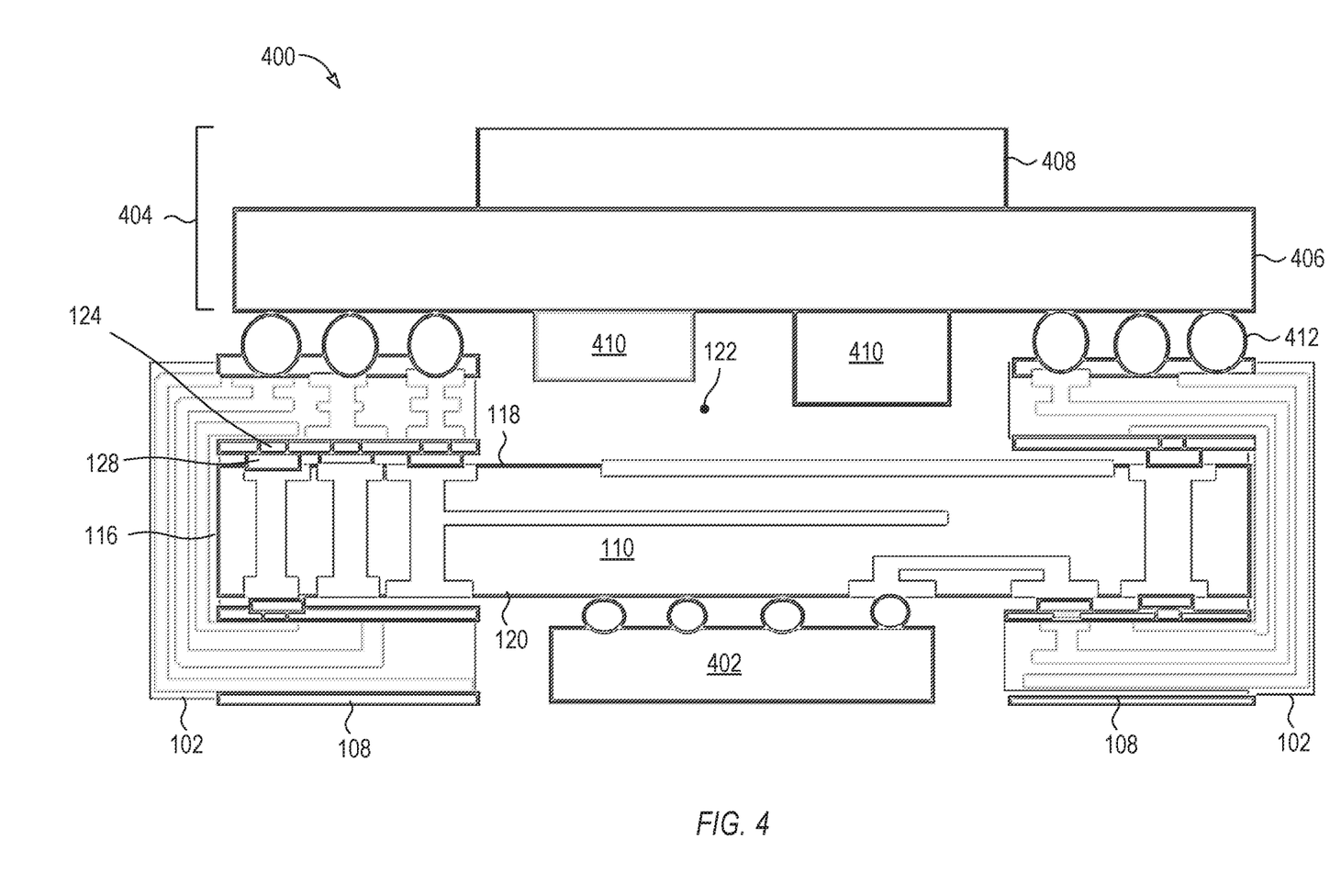
FIG. 4 shows a side-view cross-section of an example of a system that can use the interposer of FIGS. 1-3, in accordance with some examples.

FIG. 4 shows a side-view cross-section of an example of a system 400 that can use the interposer 102 of FIGS. 1-3, in accordance with some examples. The system 400 of FIG. 4 is but one example of a system 400 that can use an interposer 102 with a flexible portion 104. Other suitable systems can also be used.

In FIG. 4, an interposer 102 is electrically connected to a top side 118 of a motherboard 110, and wrapped around an edge 116 of the motherboard 110 to electrically connect to a bottom side 120 of the motherboard 110. The contact pads 124 with the interposer 102 are formed around a periphery of the cavity 122, in a view looking down on the motherboard 110. Optional memory 402 is electrically connected to a central portion of the bottom side 120 of the motherboard 110. The peripheral portion 108 of the interposer 102, when electrically connected to the bottom side 120 of the motherboard 110, can leave sufficient clearance in a central area for the optional memory 402.

In FIG. 4, the interposer 102 is electrically connected to a bottom side of a chip package 404. In some examples, the chip package 404 can electrically connect to the chip-facing side 114 of the first portion 106 of the interposer 102. In some examples, the chip package 404 can include a package substrate 406 configured to electrically connect to the interposer 102. One or more silicon dies 408 can be attached to a top side of the package substrate 406. In some examples, the package substrate 406 can be coupled to at least one electrical component 410 that extends into the cavity 122 when the package substrate 406 is electrically connected to the interposer 102. In some examples, the at least one electrical component 410 can include at least one of a passive component, a capacitor, a resistor, an inductor, or an active component.

The electrical connections 412 with the interposer 102 are formed around a periphery of the cavity 122, in a view looking down on the chip package 404. The electrical connections 412 can be formed with a package substrate 406 of the chip package 404, around a periphery of the cavity 122.

In a specific example, the system 400 of FIG. 4 can use the interposer 102 to achieve platform miniaturization. In this example, one or more silicon dies 408, such as a CPU processor, platform controller hub (PCH), programmable field gate array (FPGA), or others, can be coupled to the motherboard 110 and associated components mounted on the motherboard 110, such as a low-cost type 3 printed circuit board (PCB), through the package substrate 406. In this example, the electrical signals are routed from the silicon die 408 to one or more receivers and/or connectors mounted on the motherboard 110 through an array of package solder balls and the interposer 102.

In this specific example, the rigid-flex interposer can include at least two rigid portions, such as an organic multi-layer substrate, interconnected through a flexible central material, such as a flexible cable that includes two or three layers. In an embodiment, each rigid portion and flexible portion can be formed as an integral structure. In this integral structure, a dielectric build-up layer of the rigid portion can include material such as bismaleimide-triazine or fiber glass reinforced epoxy polymer. In this integral structure, the flexible central material can include polyimide or liquid crystal polymer (LCP) material. In this example, at least a part of the rigid portions can include a cavity to house the land side components, such as passive decoupling capacitors or active semiconductor devices. In this example, the cavity of the interposer can be formed by removing rigid material at the center region of the rigid portion via a mechanical drill process. In some examples, all or a portion of the cavity can be formed as the area or volume between the peripheral ends of the interposer.

In some examples, the interposer 102 can be used to route some electrical signals to bypass a capacitive structure, such as a plated through hole (PTH) structure of the motherboard 110, which can be beneficial. For example, a silicon device, such as a central processing unit (CPU), can direct an electrical signal or signals to the components or a memory device mounted on a bottom side 120 of the motherboard 110, through an array of package bumps and the flexible printed circuit or interconnects positioned within the flexible portion 104 of the interposer 102, which can bypass the motherboard 110 PTH structure. The bypass interconnect through the flexible portion 104 can improve electrical performance, such as by reducing return loss or reducing channel impedance discontinuity. In some examples, the flexible portion 104 (including a flexible center of the rigid portions) can be formed from a low-loss dielectric material, such as polyimide or a liquid crystal polymer with a loss tangent ($D_f$) ranging from 0.01 to 0.001, which can further reduce channel insertion loss. In other examples, the silicon device can direct an electrical signal or signals to the components mounted on the motherboard 110 through direct contact between the rigid portion of the interposer 102 and the motherboard 110. In a specific example, the direct contact can be achieved through a conductive layer 128, such as a solder diffusion layer or an anisotropic conductive film (ACF) layer, between the contact pads 124 of the interposer 102 and the contact pads (similar to contact pads 1008 in FIG. 10) of the motherboard 110.

In the examples of FIGS. 1-4, the interposer 102 includes rigid portions at the longitudinal ends of the interposer 102. When the interposer 102 is wrapped around edges 116 of the motherboard 110, the rigid portions can contact the bottom side 120 of the motherboard 110. As an alternative, other configurations are possible, in which the longitudinal ends of the interposer remain flexible.

Figure 5:
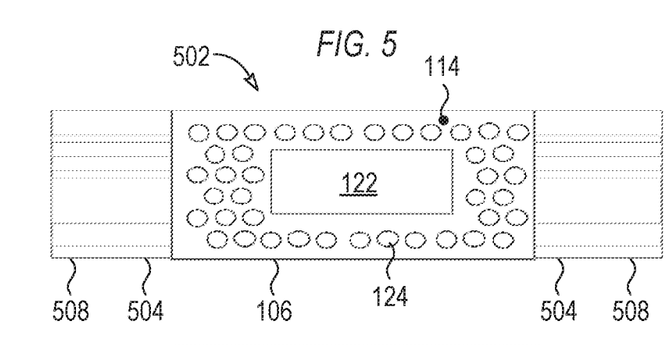
FIG. 5 shows a top view of an example of an interposer with a flexible portion, in accordance with some examples, in which the peripheral portions of the interposer remain flexible.
Figure 6:
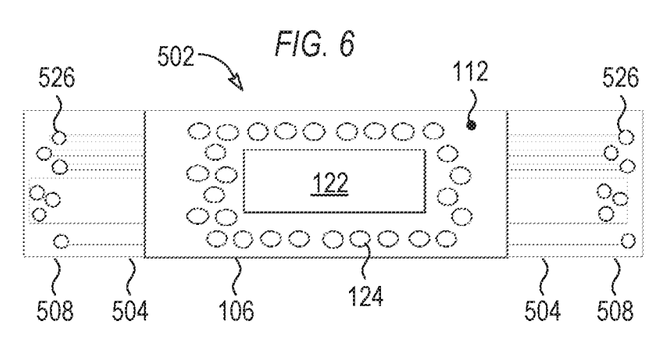
FIG. 6 shows a bottom view of the interposer of FIG. 5, in accordance with some examples.

FIG. 5 shows a top view of an example of an interposer 502 with a flexible portion 504, in accordance with some examples, in which the peripheral portions 508 of the interposer 502 remain flexible. FIG. 6 shows a bottom view of the interposer 502 of FIG. 5, in accordance with some examples. Other aspects of the interposer 502 are the same as the configuration shown in FIGS. 1-4, including the cavity 122 through first portion 106 of the interposer 502, and the plurality of contact pads 124 positioned around the cavity 122 on the motherboard-facing side 112 of the interposer 102 and the chip-facing side 114 of the interposer 102.

The interposer 502 of FIGS. 5-6 has peripheral portions 508 that are flexible, compared with the rigid peripheral portions 108 shown in the interposer of FIGS. 1-4. In some examples, the flexible portion 504 and the peripheral portion 508 may have the same basic construction, such as being formed from the same materials and having a same width (top-to-bottom in FIGS. 5-6). In these examples, the peripheral portion 508 can include contact pads 526 that can connect to a bottom side of a motherboard 110, while the flexible portion can lack such contact pads 526.

In a specific example, the interposer 502 can include one rigid portion 106 and two flexible portions 504, 508. In this example, a portion of the electrical signals can be routed to the motherboard components and/or components embedded within the motherboard (not shown) through a bottom side of the motherboard 110, which can bypass the motherboard PTH. In some examples, the interposer 502 can be compatible with a single-sided PCB configuration.

Figure 7:
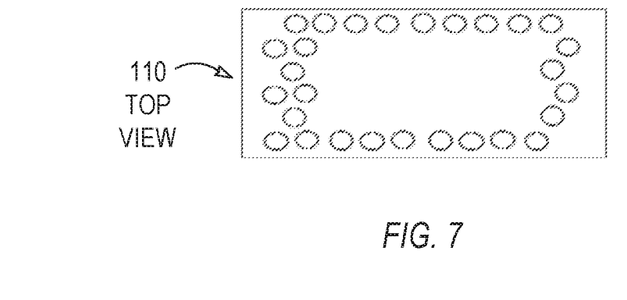
FIG. 7 shows a top view of the corresponding motherboard, which electrically contacts the motherboard-facing side of the interposer (at the central portion of FIG. 6), in accordance with some examples.
Figure 8:
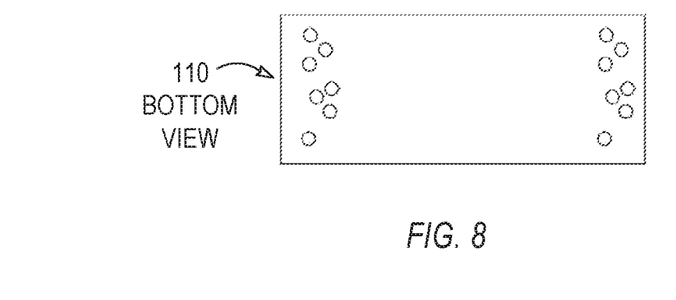
FIG. 8 shows a bottom view of the motherboard of FIG. 7, which electrically contacts the motherboard-facing side of the interposer (at the left and right ends of FIG. 6), in accordance with some examples.

FIG. 7 shows a top view of the corresponding motherboard 110, which electrically contacts the motherboard-facing side 112 of the interposer 502 (at the central portion of FIG. 6), in accordance with some examples. FIG. 8 shows a bottom view of the motherboard 110 of FIG. 7, which electrically contacts the motherboard-facing side 112 of the interposer 502 (at the left and right ends of FIG. 6), in accordance with some examples.

Figure 9:
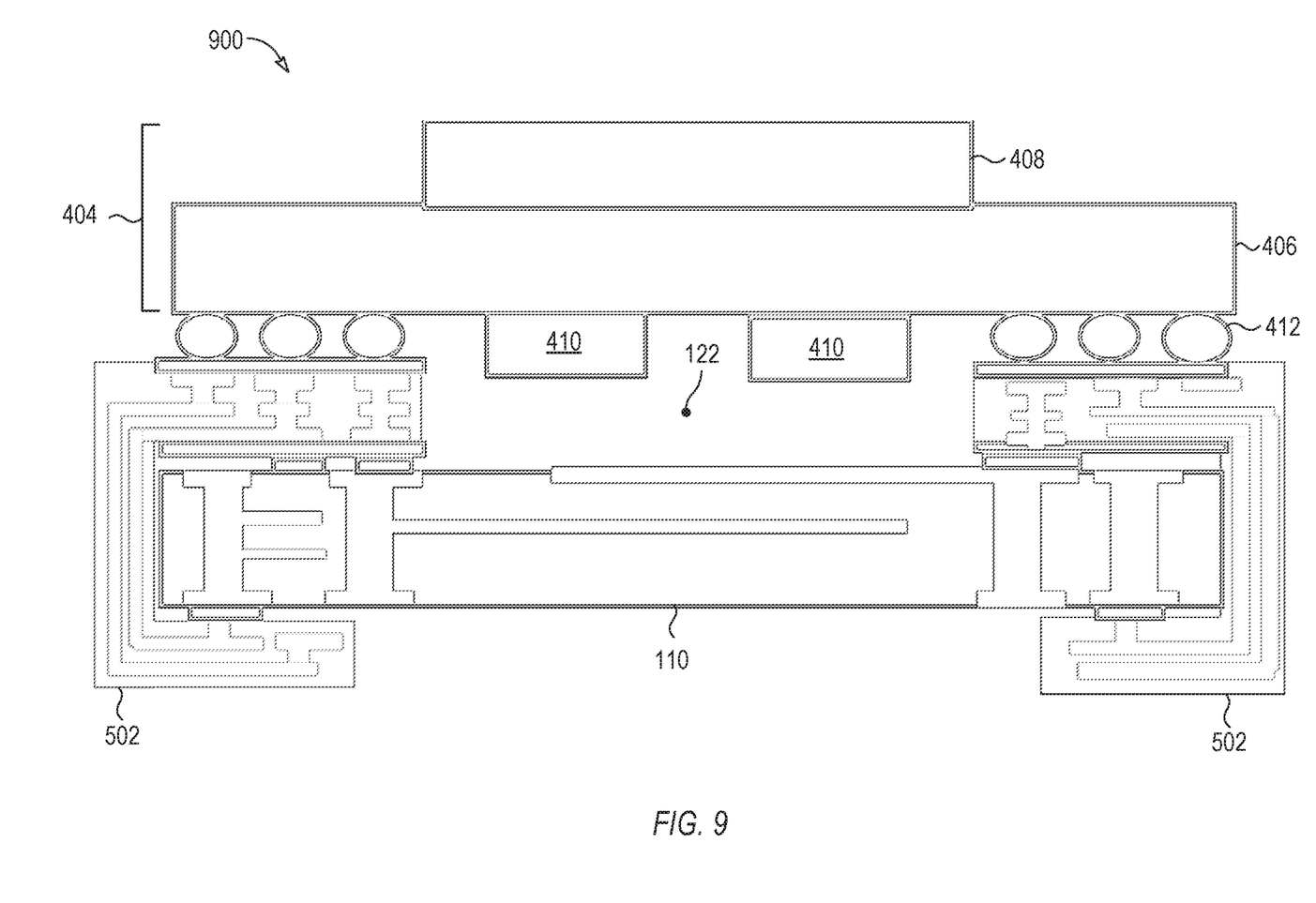
FIG. 9 shows a side-view cross-section of an example of a system that can use the interposer of FIGS. 5-6, in accordance with some examples.

FIG. 9 shows a side-view cross-section of an example of a system 900 that can use the interposer 502 of FIGS. 5-6, in accordance with some examples. The system of FIG. 9 is but one example of a system that can use an interposer with a flexible portion. Other suitable systems can also be used.

In the example of FIG. 9, there is no memory attached to the bottom side of the motherboard 110 or embedded within the motherboard 110. As an alternative, memory can be attached to the bottom side of the motherboard 110. Similarly, the memory 402 shown in the system of FIG. 4 can optionally be omitted.

FIGS. 10-14 show an assembly process for the system of FIG. 4, as various components of the system are formed and attached to one another.

Figure 10:
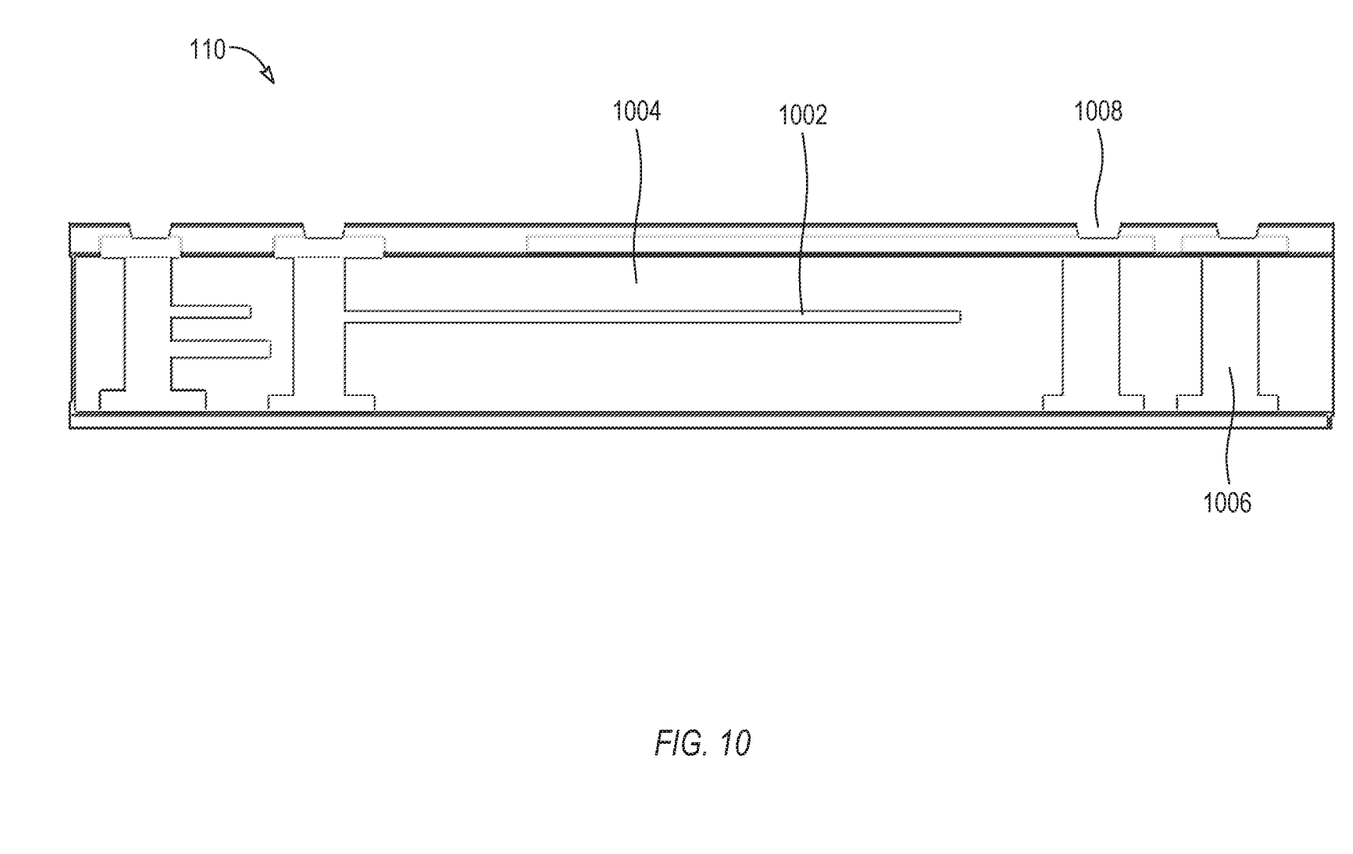
FIGS. 10-14 show an assembly process for the system of FIG. 4, as various components of the system are formed and attached to one another.

The motherboard 110 can be formed independently of other elements of the system. FIG. 10 shows a side-view cross-section of a manufactured motherboard 110, in accordance with some examples. In some examples, the motherboard 110 can be a type 3/1×1+ printed circuit board, which can include between six and ten layers. Other numbers of layers can also be used. Using a type 3 motherboard can be less expensive than using a type 4 motherboard, which is beneficial. The motherboard 110 can be formed using a combination of lamination, hot-press, mechanical, laser drilling, photolithography, and etching processes. The completed motherboard 110 can include metal routing 1002, one or more dielectric layers 1004, one or more plated through-holes 1006, and one or more contact pads 1008.

Figure 11:
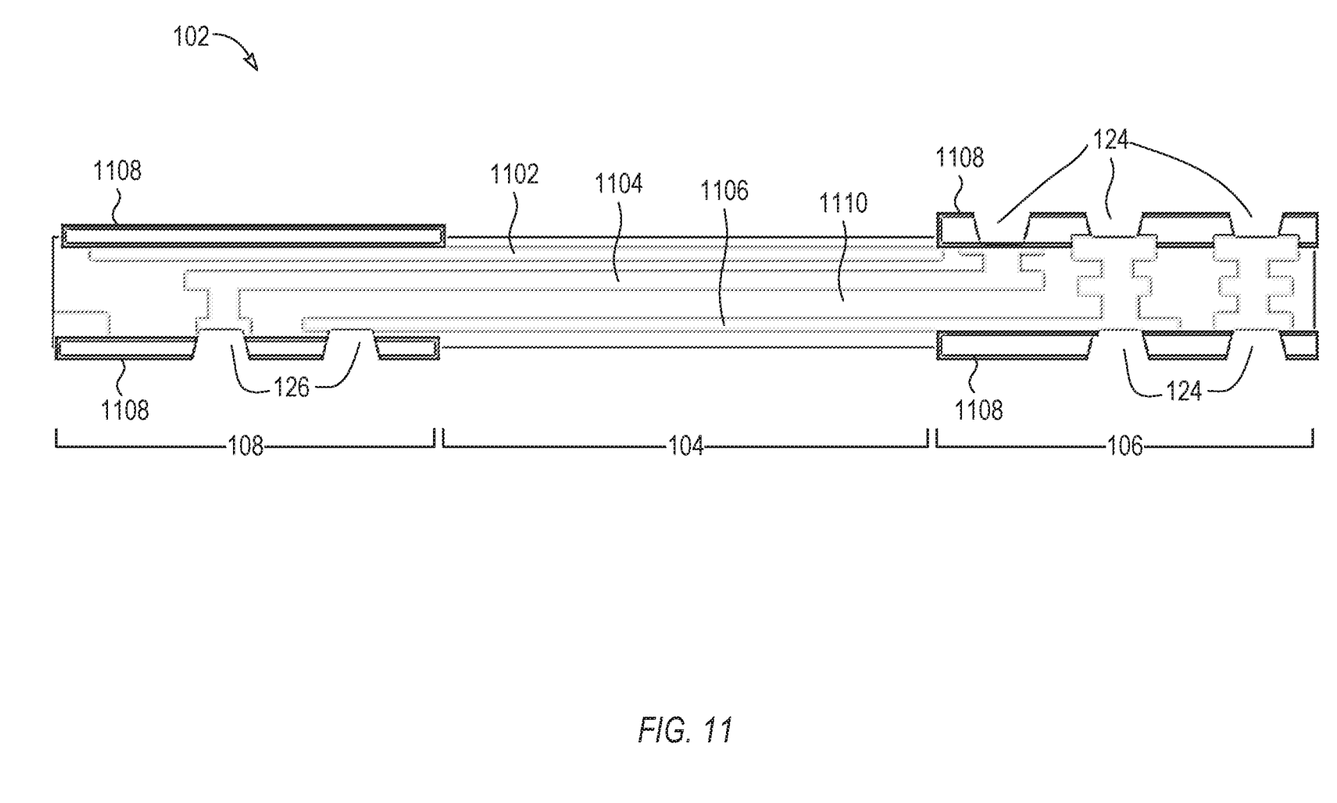

The interposer 102 can be formed independently of other elements of the system. FIG. 11 shows a side-view cross-section of half of a manufactured interposer 102, in accordance with some examples. In FIG. 11, only half of the interposer 102 is shown, from half of the first portion to a peripheral portion; it will be understood that the other half of the interposer 102 can be formed in a similar manner. The interposer 102 can be formed using a combination of lamination, hot-press, drilling, and photolithography processes. In some examples, the interposer 102 can be a four-layer rigid-flex interposer board. In some examples, the interposer 102 can include three internal flex layers 1102, 1104, 1106. Other numbers of layers can also be used.

In some examples, the first portion 106 and the peripheral portion 108 can be rigid. In some examples, the rigid portions can be formed as rigid layers 1108 surrounding a flexible interior 1110. In some examples, the rigid layers can be formed from a rigid material, such as Prepeg FR4 fiber resin. Other suitable materials can also be used. In other examples, the peripheral portion can be flexible, as discussed above.

In some examples the peripheral portion 108 and the first portion 106 can include contact pads 124 and contact pads 126. In some examples, the contact pads 126 on the peripheral portion 108 can electrically connect to the contact pads 124 on both sides of the first portion 106. In some examples, each contact pad 124 and contact pad 126 can be a ball grid assembly pad formed as a hole in the respective rigid layer that exposes a conductive material (e.g., a metal pad, a metal via, or metal routing) beneath the rigid layer. Other suitable constructions can also be used.

Figure 12:
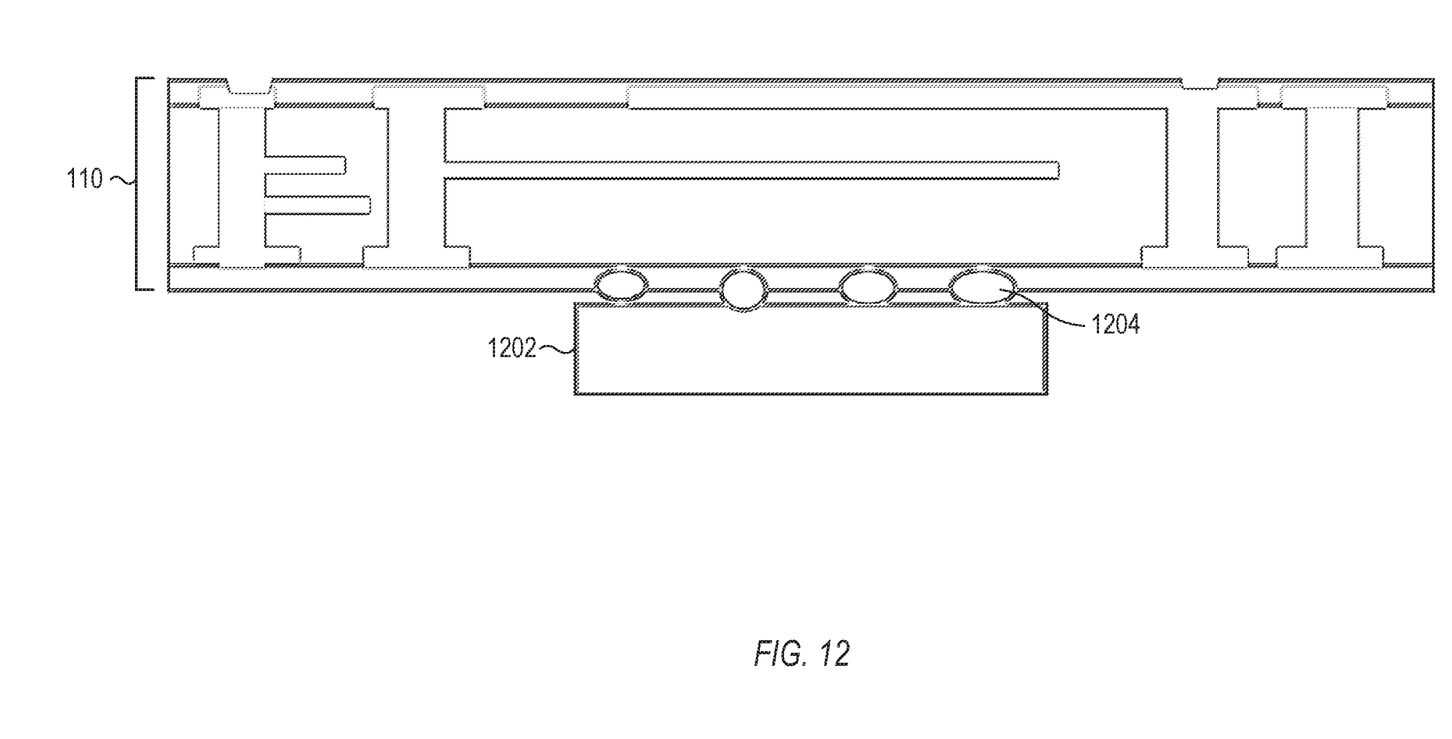

FIG. 12 shows an example of an electronic component, such as memory, attached to a bottom side of a motherboard 110, in accordance with some examples. Compared with the motherboard 110 shown in FIG. 10, an electronic component 1202 has been attached to the bottom side, using a solder reflow process that uses solder balls 1204. Other suitable connection techniques can also be used.

Figure 13:
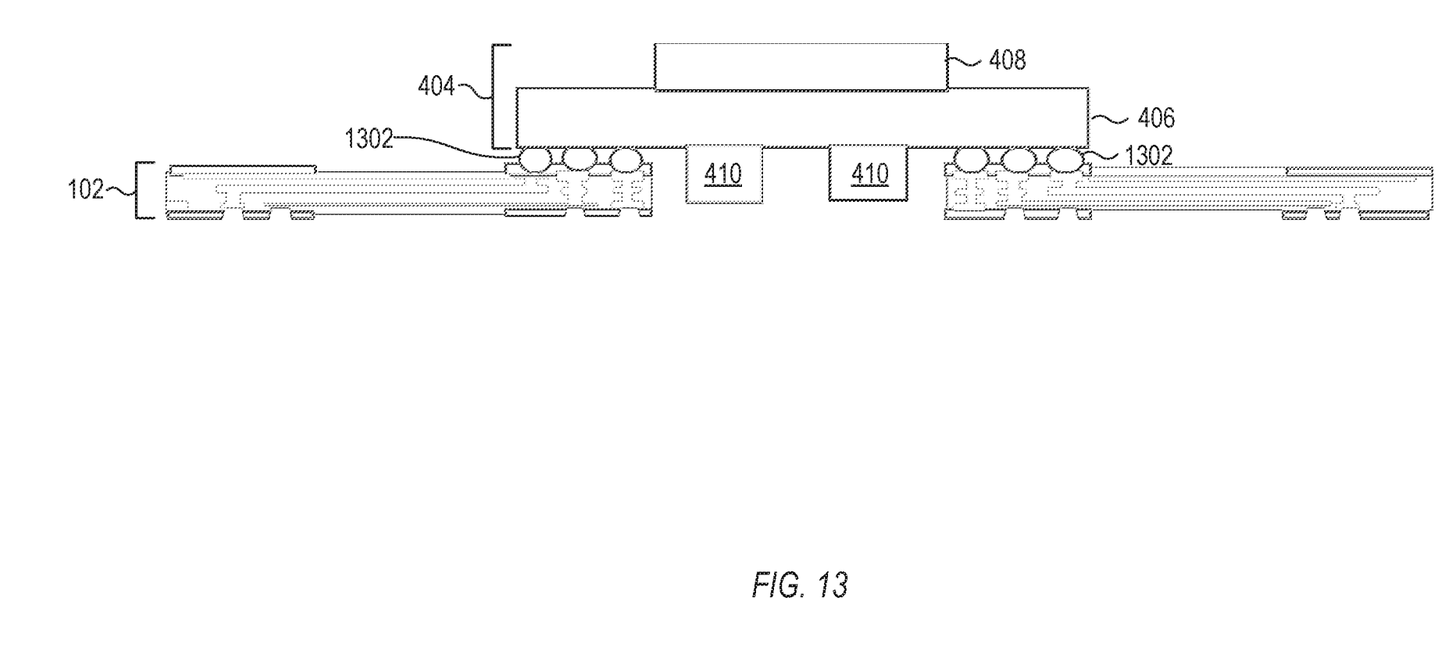

FIG. 13 shows an example of a chip package 404 mounted onto an interposer 102, in accordance with some examples. In some examples, the chip package 404 can be mounted using a solder reflow process that uses solder balls 1302. Other suitable connection techniques can also be used.

Figure 14:
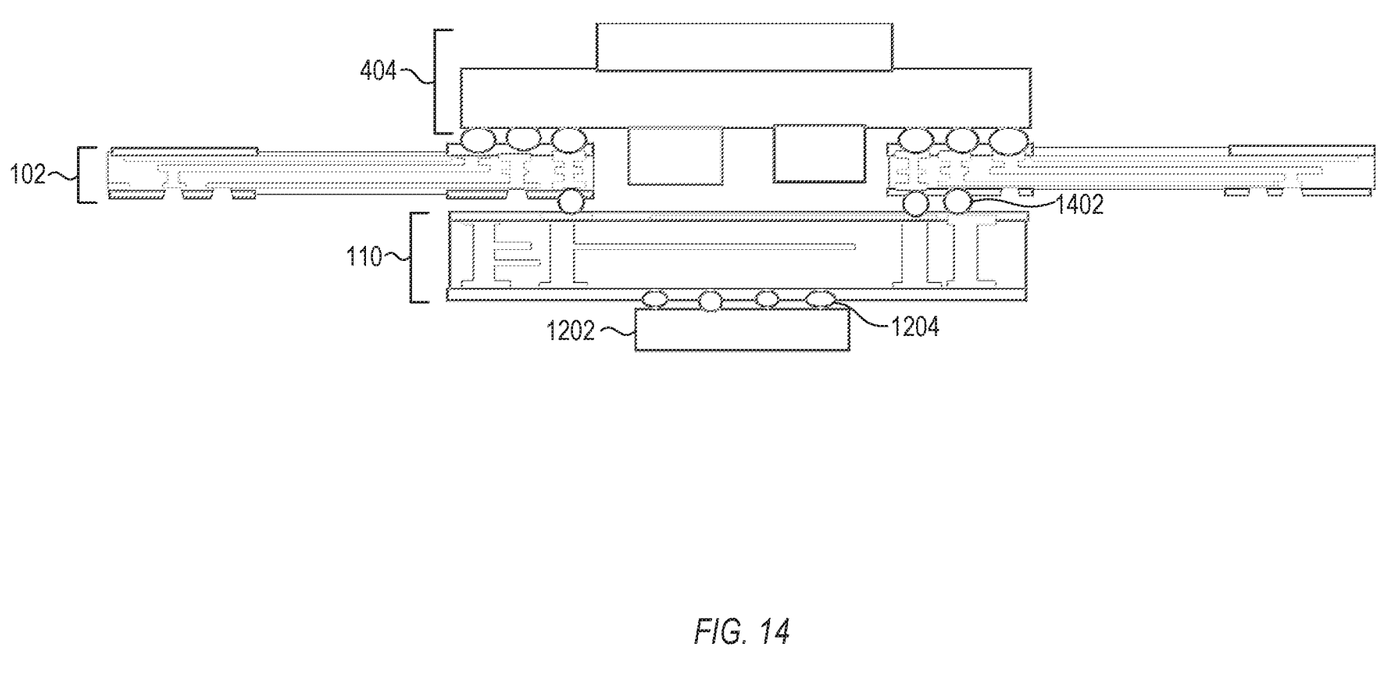

FIG. 14 shows an example of a motherboard 110 and electronic component 1202 attached to the chip package and interposer 102, in accordance with some examples. In some examples, a top side of the motherboard 110 is attached to the motherboard-facing side of the interposer 102 using a low-temperature solder or anisotropic conductive film attachment process. In some examples, the attachment is made via solder paste 1402. Other suitable connection techniques can also be used.

After the attachment operation of FIG. 14, the flexible portions of the interposer 102 can be wrapped around lateral edges of the motherboard 110 by mechanical folding. The peripheral portions of the interposer 102 can be attached to a bottom side of the motherboard 110 using a low-temperature solder or anisotropic conductive film attachment process, to form the system 400 shown in FIG. 4. Similar assembly techniques can also be used to form the system 900 shown in FIG. 9.

Figure 15:
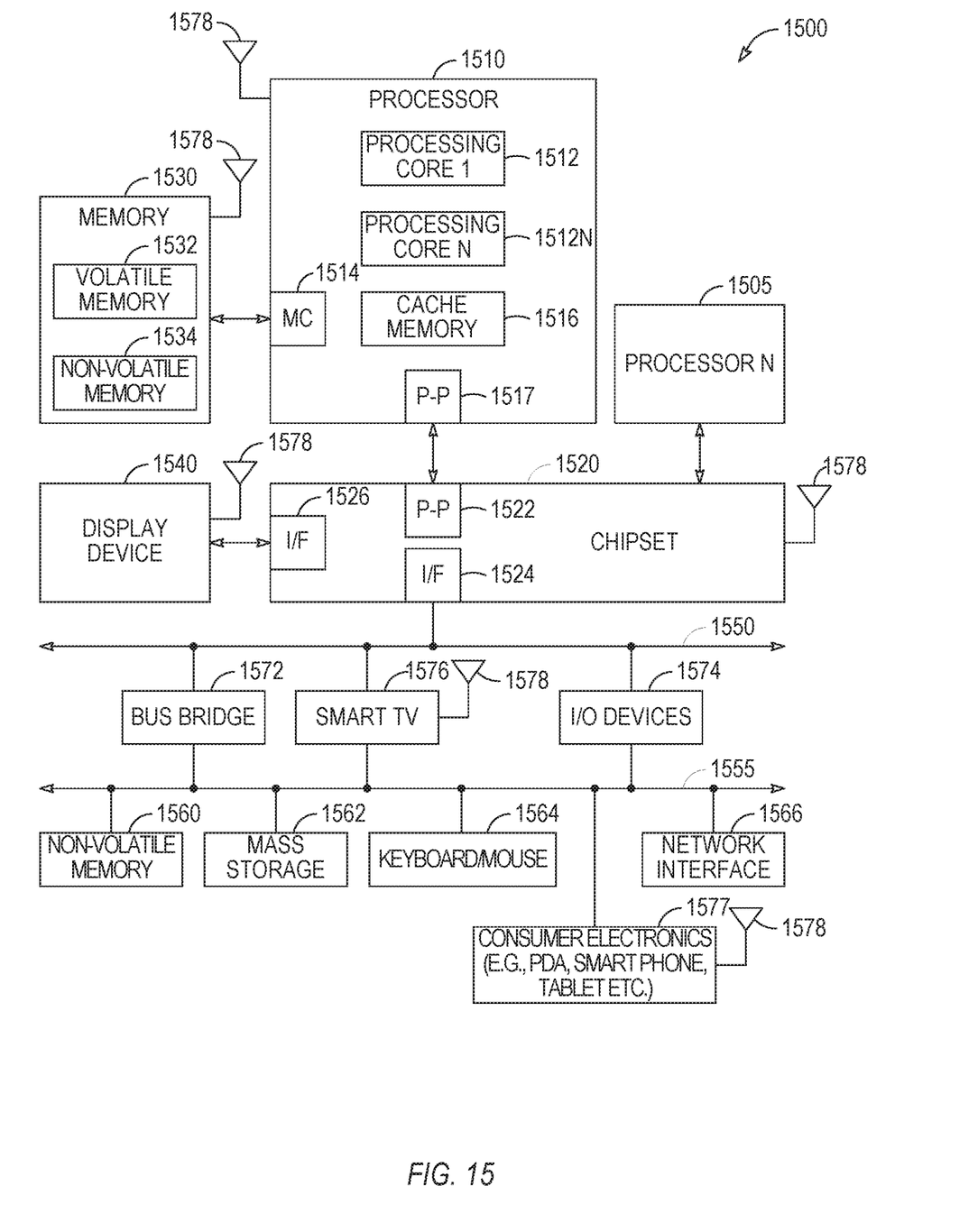
FIG. 15 illustrates a system level diagram, depicting an example of an electronic device (e.g., system) including the interposer and system as described in the present disclosure.

FIG. 15 illustrates a system level diagram, depicting an example of an electronic device (e.g., system) including the interposer and system as described in the present disclosure. FIG. 15 is included to show an example of a higher-level device application for the interposer and system. In one embodiment, system 1500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1500 is a system on a chip (SOC) system.

In one embodiment, processor 1510 has one or more processor cores 1512 and 1512N, where 1512N represents the Nth processor core inside processor 1510 where N is a positive integer. In one embodiment, system 1500 includes multiple processors including 1510 and 1505, where processor 1505 has logic similar or identical to the logic of processor 1510. In some embodiments, processing core 1512 includes, but is not limited to, pre-fetch logic to fetch instructions, decode logic to decode the instructions, execution logic to execute instructions and the like. In some embodiments, processor 1510 has a cache memory 1516 to cache instructions and/or data for system 1500. Cache memory 1516 may be organized into a hierarchal structure including one or more levels of cache memory.

In some embodiments, processor 1510 includes a memory controller 1514, which is operable to perform functions that enable the processor 1510 to access and communicate with memory 1530 that includes a volatile memory 1532 and/or a non-volatile memory 1534. In some embodiments, processor 1510 is coupled with memory 1530 and chipset 1520. Processor 1510 may also be coupled to a wireless antenna 1578 to communicate with any device configured to transmit and/or receive wireless signals. In one embodiment, an interface for wireless antenna 1578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 1534 includes, but is not limited to, flash memory, phase change memory (PCM), read-only memory (ROM), electrically erasable programmable read-only memory (EEPROM), or any other type of non-volatile memory device.

Memory 1530 stores information and instructions to be executed by processor 1510. In one embodiment, memory 1530 may also store temporary variables or other intermediate information while processor 1510 is executing instructions. In the illustrated embodiment, chipset 1520 connects with processor 1510 via Point-to-Point (PtP or P-P) interfaces 1517 and 1522. Chipset 1520 enables processor 1510 to connect to other elements in system 1500. In some embodiments of the example system, interfaces 1517 and 1522 operate in accordance with a PtP communication protocol such as the Intel® QuickPath Interconnect (QPI) or the like. In other embodiments, a different interconnect may be used.

In some embodiments, chipset 1520 is operable to communicate with processor 1510, 1505N, display device 1540, and other devices, including a bus bridge 1572, a smart TV 1576, 110 devices 1574, nonvolatile memory 1560, a storage medium (such as one or more mass storage devices) 1562, a keyboard/mouse 1564, a network interface 1566, and various forms of consumer electronics 1577 (such as a PDA, smart phone, tablet etc.), etc. In one embodiment, chipset 1520 couples with these devices through an interface 1524. Chipset 1520 may also be coupled to a wireless antenna 1578 to communicate with any device configured to transmit and/or receive wireless signals.

Chipset 1520 connects to display device 1540 via interface 1526. Display 1540 may be, for example, a liquid crystal display (LCD), a light emitting diode (LED) array, an organic light emitting diode (OLED) array, or any other form of visual display device. In some embodiments of the example system, processor 1510 and chipset 1520 are merged into a single SOC. In addition, chipset 1520 connects to one or more buses 1550 and 1555 that interconnect various system elements, such as I/O devices 1574, non-volatile memory 1560, storage medium 1562, a keyboard/mouse 1564, and network interface 1566. Buses 1550 and 1555 may be interconnected together via a bus bridge 1572.

In one embodiment, mass storage device 1562 includes, but is not limited to, a solid-state drive, a hard disk drive, a universal serial bus flash memory drive, or any other form of computer data storage medium. In one embodiment, network interface 1566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 15 are depicted as separate blocks within the system 1500, the functions performed by some of these blocks may be integrated within a single semiconductor circuit or may be implemented using two or more separate integrated circuits. For example, although cache memory 1516 is depicted as a separate block within processor 1510, cache memory 1516 (or selected aspects of 1516) can be incorporated into processor core 1512.

Figure 16:
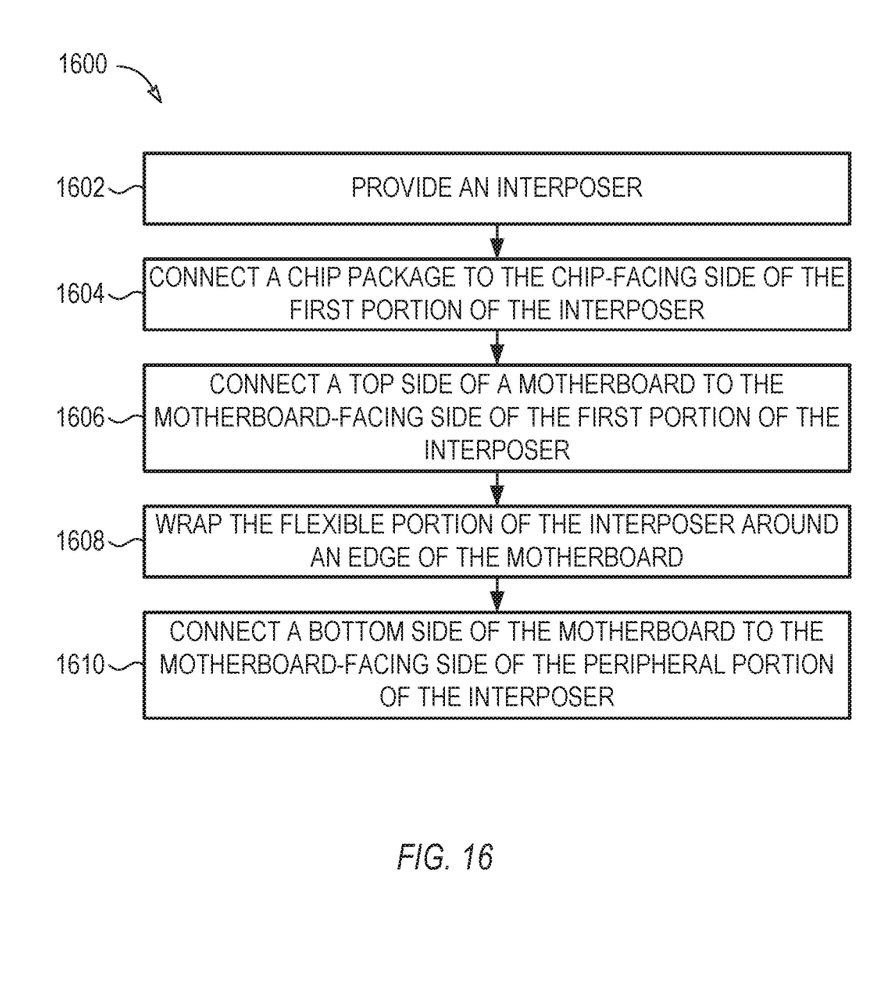
FIG. 16 shows a flowchart of an example of a method for manufacturing a system, in accordance with some embodiments.

FIG. 16 shows a flowchart of an example of a method 1600 for manufacturing a system, in accordance with some embodiments. The method 1600 is suitable for manufacturing the system 400 of FIG. 4 and the system 900 of FIG. 9, among other devices. The method 1600 is but one method for manufacturing a system; other suitable methods can also be used.

At operation 1602, an interposer is provided. The interposer can include a first portion configured to electrically connect to a top side of a motherboard. The interposer can include a flexible portion adjacent to the first portion and configured to wrap around an edge of the motherboard. The interposer can include a peripheral portion adjacent to the flexible portion and configured to electrically connect to a bottom side of the motherboard. The interposer can include a motherboard-facing side and a chip-facing side opposite the motherboard-facing side. The motherboard-facing side can electrically connect to the top side of the motherboard and electrically connect to the bottom side of the motherboard. The first portion of the interposer can define a cavity that extends from the motherboard-facing side of the interposer to chip-facing side of the interposer.

At operation 1604, a package substrate of a chip package can be electrically connected to the chip-facing side of the first portion of the interposer. The package substrate can be coupled to least one electrical component that extends into the cavity.

At operation 1606, the top side of the motherboard can be electrically connected to the motherboard-facing side of the first portion of the interposer.

At operation 1608, the flexible portion of the interposer can be wrapped around an edge of the motherboard.

At operation 1610, the bottom side of the motherboard can be electrically connected to the motherboard-facing side of the peripheral portion of the interposer.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a system can include: a motherboard; and an interposer including a first portion configured to electrically connect to a top side of the motherboard, the interposer including a flexible portion adjacent to the first portion and configured to wrap around an edge of the motherboard, the interposer including a peripheral portion adjacent to the flexible portion and configured to electrically connect to a bottom side of the motherboard.

In Example 2, the system of Example 1 can optionally be configured such that the interposer includes a motherboard-facing side and a chip-facing side opposite the motherboard-facing side; and the motherboard-facing side configured to electrically connect to the top side of the motherboard and the bottom side of the motherboard.

In Example 3, the system of any one of Examples 1-2 can optionally be configured such that the first portion of the interposer defines a cavity that extends from the motherboard-facing side of the interposer to chip-facing side of the interposer.

In Example 4, the system of any one of Examples 1-3 can optionally further include a chip package configured to electrically connect to the chip-facing side of the first portion of the interposer.

In Example 5, the system of any one of Examples 1-4 can optionally be configured such that the chip package includes a package substrate configured to electrically connect to the interposer; and the package substrate is coupled to at least one electrical component that extends into the cavity when the package substrate is electrically connected to the interposer.

In Example 6, the system of any one of Examples 1-5 can optionally be configured such that the at least one electrical component includes at least one of a passive component, a capacitor, a resistor, an inductor, or an active component.

In Example 7, the system of any one of Examples 1-6 can optionally be configured such that the first portion of the interposer includes a plurality of contact pads positioned around the cavity on the motherboard-facing side of the interposer and the chip-facing side of the interposer.

In Example 8, the system of any one of Examples 1-7 can optionally be configured such that the first portion of the interposer is rigid.

In Example 9, the system of any one of Examples 1-8 can optionally be configured such that the first portion of the interposer is formed from a pair of rigid layers surrounding a flexible interior; and each contact pad on the first portion is a ball grid assembly pad formed as a hole in the respective rigid layer that exposes a conductive material beneath the rigid layer.

In Example 10, the system of any one of Examples 1-9 can optionally be configured such that the peripheral portion of the interposer includes a plurality of contact pads on the motherboard-facing side of the interposer.

In Example 11, the system of any one of Examples 1-10 can optionally be configured such that the flexible portion electrically connects the contact pads on the peripheral portion of the interposer to corresponding contact pads on the first portion of the interposer.

In Example 12, the system of any one of Examples 1-11 can optionally be configured such that the flexible portion is bendable by 180 degrees in a U-shape such that the motherboard-facing side of the interposer bends concavely, and the chip-facing side of the interposer bends convexly; and when the flexible portion is bent by 180 degrees, the plurality of contact pads on the motherboard-facing side of the interposer are positioned on a sidewall of the U-shape facing an interior of the U-shape.

In Example 13, the system of any one of Examples 1-12 can optionally be configured such that the peripheral portion of the interposer is flexible.

In Example 14, the system of any one of Examples 1-13 can optionally be configured such that the peripheral portion of the interposer is rigid; the peripheral portion of the interposer is formed from a pair of rigid layers surrounding a flexible interior; and each contact pad on the peripheral portion is a ball grid assembly pad formed as a hole in the respective rigid layer that exposes a conductive material beneath the rigid layer.

In Example 15, the system of any one of Examples 1-14 can optionally be configured such that the interposer is shaped as a generally planar elongated rectangle, with the peripheral portion positioned at an edge of the rectangle, the flexible portion positioned directly adjacent to the peripheral portion, and the first portion positioned directly adjacent to the flexible portion.

In Example 16, the system of any one of Examples 1-15 can optionally be configured such that the interposer is shaped as a generally planar elongated rectangle; the first portion is positioned at a central portion of the rectangle; the peripheral portion includes two non-contiguous peripheral portions, each non-contiguous peripheral portion extending to a respective edge of the rectangle; and the flexible portion includes two non-contiguous flexible portions, each non-contiguous flexible portion positioned between the first portion and a respective non-contiguous peripheral portion.

In Example 17, a method can include: providing an interposer, the interposer including a first portion configured to electrically connect to a top side of a motherboard, the interposer including a flexible portion adjacent to the first portion and configured to wrap around an edge of the motherboard, the interposer including a peripheral portion adjacent to the flexible portion and configured to electrically connect to a bottom side of the motherboard, the interposer including a motherboard-facing side and a chip-facing side opposite the motherboard-facing side, the motherboard-facing side configured to electrically connect to the top side of the motherboard and electrically connect to the bottom side of the motherboard, the first portion of the interposer defining a cavity that extends from the motherboard-facing side of the interposer to chip-facing side of the interposer; electrically connecting a package substrate of a chip package to the chip-facing side of the first portion of the interposer, the package substrate coupled to least one electrical component that extends into the cavity; electrically connecting the top side of the motherboard to the motherboard-facing side of the first portion of the interposer; wrapping the flexible portion of the interposer around an edge of the motherboard; and electrically connecting the bottom side of the motherboard to the motherboard-facing side of the peripheral portion of the interposer.

In Example 18, the method of Example 17 can optionally be configured such that the motherboard is a type 3 circuit board.

In Example 19, a system can include: a motherboard; and an interposer including a rigid first portion electrically connected to a top side of the motherboard, the interposer including a flexible portion adjacent to the first portion and wrapped around an edge of the motherboard, the interposer including a peripheral portion adjacent to the flexible portion and electrically connected to a bottom side of the motherboard, the interposer including a motherboard-facing side and a chip-facing side opposite the motherboard-facing side, the motherboard-facing side electrically connected to the top side of the motherboard and electrically connected to the bottom side of the motherboard, the first portion of the interposer defining a cavity extending from the motherboard-facing side of the interposer to chip-facing side of the interposer; a chip package electrically connected to the chip-facing side of the first portion of the interposer, the chip package including a package substrate electrically connected to the interposer, the package substrate coupled to least one electrical component that extends into the cavity.

In Example 20, the system of Example 19 can optionally be configured such that the peripheral portion of the interposer is rigid.

What is claimed is:

1. A system, comprising:
a motherboard; and
an interposer including a first portion configured to electrically connect to a top side of the motherboard, the interposer including a flexible portion adjacent to the first portion and configured to wrap around an edge of the motherboard, the interposer including a peripheral portion adjacent to the flexible portion and configured to electrically connect to a bottom side of the motherboard.

2. The system of claim 1, wherein:
the interposer includes a motherboard-facing side and a chip-facing side opposite the motherboard-facing side; and
the motherboard-facing side configured to electrically connect to the top side of the motherboard and the bottom side of the motherboard.

3. The system of claim 2, wherein the first portion of the interposer defines a cavity that extends from the motherboard-facing side of the interposer to the chip-facing side of the interposer.

4. The system of claim 3, further comprising a chip package configured to electrically connect to the chip-facing side of the first portion of the interposer.

5. The system of claim 4, wherein:
the chip package includes a package substrate configured to electrically connect to the interposer; and
the package substrate is coupled to at least one electrical component that extends into the cavity when the package substrate is electrically connected to the interposer.

6. The system of claim 5, wherein the at least one electrical component includes at least one of a passive component, an active component, a capacitor, a resistor, or an inductor.

7. The system of claim 3, wherein the first portion of the interposer includes a plurality of contact pads positioned around the cavity on the motherboard-facing side of the interposer and the chip-facing side of the interposer.

8. The system of claim 7, wherein the first portion of the interposer is rigid.

9. The system of claim 8, wherein:
the first portion of the interposer is formed from a pair of rigid layers surrounding a flexible interior; and
each contact pad on the first portion is a ball grid assembly pad formed as a hole in the respective rigid layer that exposes a conductive material beneath the rigid layer.

10. The system of claim 1, wherein the peripheral portion of the interposer includes a plurality of contact pads on the motherboard-facing side of the interposer.

11. The system of claim 10, wherein the flexible portion electrically connects the contact pads on the peripheral portion of the interposer to corresponding contact pads on the first portion of the interposer.

12. The system of claim 10, wherein:
the flexible portion is bendable by 180 degrees in a U-shape such that the motherboard-facing side of the interposer bends concavely, and the chip-facing side of the interposer bends convexly; and
when the flexible portion is bent by 180 degrees, the plurality of contact pads on the motherboard-facing side of the interposer are positioned on a sidewall of the U-shape facing an interior of the U-shape.

13. The system of claim 10, wherein the peripheral portion of the interposer is flexible.

14. The system of claim 10, wherein:
the peripheral portion of the interposer is rigid;
the peripheral portion of the interposer is formed from a pair of rigid layers surrounding a flexible interior; and
each contact pad on the peripheral portion is a ball grid assembly pad formed as a hole in the respective rigid layer that exposes a conductive material beneath the rigid layer.

15. The system of claim 1, wherein the interposer is shaped as a generally planar elongated rectangle, with the peripheral portion positioned at an edge of the rectangle, the flexible portion positioned directly adjacent to the peripheral portion, and the first portion positioned directly adjacent to the flexible portion.

16. The system of claim 1, wherein:
the interposer is shaped as a generally planar elongated rectangle;
the first portion is positioned at a central portion of the rectangle;
the peripheral portion includes two non-contiguous peripheral portions, each non-contiguous peripheral portion extending to a respective edge of the rectangle; and
the flexible portion includes two non-contiguous flexible portions, each non-contiguous flexible portion positioned between the first portion and a respective non-contiguous peripheral portion.

17. A method, comprising:
providing an interposer, the interposer including a first portion configured to electrically connect to a top side of a motherboard, the interposer including a flexible portion adjacent to the first portion and configured to wrap around an edge of the motherboard, the interposer including a peripheral portion adjacent to the flexible portion and configured to electrically connect to a bottom side of the motherboard, the interposer including a motherboard-facing side and a chip-facing side opposite the motherboard-facing side, the motherboard-facing side configured to electrically connect to the top side of the motherboard and electrically connect to the bottom side of the motherboard, the first portion of the interposer defining a cavity that extends from the motherboard-facing side of the interposer to the chip-facing side of the interposer;
electrically connecting a package substrate of a chip package to the chip-facing side of the first portion of the interposer, the package substrate coupled to at least one electrical component that extends into the cavity;
electrically connecting the top side of the motherboard to the motherboard-facing side of the first portion of the interposer;
wrapping the flexible portion of the interposer around the edge of the motherboard; and
electrically connecting the bottom side of the motherboard to the motherboard-facing side of the peripheral portion of the interposer.

18. The method of claim 17, wherein the motherboard is a type 3 circuit board.

19. A system, comprising:
a motherboard; and
an interposer including a rigid first portion electrically connected to a top side of the motherboard, the interposer including a flexible portion adjacent to the first portion and wrapped around an edge of the motherboard, the interposer including a peripheral portion adjacent to the flexible portion and electrically connected to a bottom side of the motherboard, the interposer including a motherboard-facing side and a chip-facing side opposite the motherboard-facing side, the motherboard-facing side electrically connected to the top side of the motherboard and electrically connected to the bottom side of the motherboard, the first portion of the interposer defining a cavity extending from the motherboard-facing side of the interposer to the chip-facing side of the interposer;
a chip package electrically connected to the chip-facing side of the first portion of the interposer, the chip package including a package substrate electrically connected to the interposer, the package substrate coupled to at least one electrical component that extends into the cavity.

20. The system of claim 19, wherein the peripheral portion of the interposer is rigid.

* * * * *